United States Patent
Kitano et al.

(10) Patent No.: US 6,617,095 B2
(45) Date of Patent: Sep. 9, 2003

(54) EVALUATING METHOD OF HYDROPHOBIC PROCESS, FORMING METHOD OF RESIST PATTERN, AND FORMING SYSTEM OF RESIST PATTERN

(75) Inventors: Junichi Kitano, Nirasaki (JP); Keiko Hada, Nirasaki (JP); Yuko Ono, Nirasaki (JP); Takayuki Katano, Nirasaki (JP); Hidefumi Matsui, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/827,095

(22) Filed: Apr. 6, 2001

(65) Prior Publication Data

US 2002/0009592 A1 Jan. 24, 2002

(30) Foreign Application Priority Data

Apr. 7, 2000 (JP) ........................................ 2000-106515

(51) Int. Cl.⁷ .......................... C23C 16/00; H01L 21/00
(52) U.S. Cl. .......................... 430/313; 430/11; 430/30; 118/712
(58) Field of Search ............................ 430/11, 30, 313; 427/8, 759; 438/151, 405, 585, 149; 355/30; 118/712

(56) References Cited

U.S. PATENT DOCUMENTS

| | | | | | |
|---|---|---|---|---|---|
| 4,472,631 A | * | 9/1984 | Enke et al. | .................. | 250/281 |
| 5,501,870 A | * | 3/1996 | Shiraishi et al. | .............. | 438/14 |
| 5,665,214 A | * | 9/1997 | Iturralde | ................. | 204/298.03 |
| 5,695,564 A | * | 12/1997 | Imahashi | ..................... | 118/719 |
| 5,762,755 A | * | 6/1998 | McNeilly et al. | ............ | 438/714 |
| 5,897,710 A | * | 4/1999 | Sato et al. | ..................... | 427/10 |

OTHER PUBLICATIONS

G. Veercke and Co.W; "Wafer Thermal Desorption Spectrometry . . ."; IEEE Trans. on Semiconductor Mfg. v13(3), (2000), p. 315–321.*

Handbook of multilevel Metallization for Integrated Circuits; ed:S>R.Wilson and C.J.Tracy; (1997), Noyes Publication (NJ), p. 765–792.*

Mass spectrum of HMDS; NIST;(1991); Webbook.NIST.Gov/chemistry.*

* cited by examiner

Primary Examiner—Mark F. Huff
Assistant Examiner—K Sagar
(74) Attorney, Agent, or Firm—Oblon, Spivak, McClelland, Maier & Neustadt, P.C.

(57) ABSTRACT

A HMDS gas is supplied to a surface of a wafer W to perform a hydrophobic process, thereafter the wafer W is contained in an airtight container on a cassette stage, and is transferred to an analyzer provided at an external portion of a resist pattern forming apparatus. The analyzer performs mass spectrometry of the quantity of an ionic species such as $CH_9Si^+$, $C_3H_9Si^+$, $C_3H_9Osi^-$ and the like on the surface of the wafer W using an analyzing section, for example, TOF-SIMS, whereby measuring a HMDS quantity (hexamethyldisilazane) on the surface of the wafer W. This method makes it possible to measure the HMDS quantity on the surface of the wafer W and to evaluate a hydrophobic process state with high reliability.

18 Claims, 13 Drawing Sheets

EVALUATING METHOD OF HYDROPHOBIC PROCESS, FORMING METHOD OF RESIST PATTERN, AND FORMING SYSTEM OF RESIST PATTERN

BACKGROUND OF THE INVENTION

1. Field of the Invention

The present invention relates to an evaluating method of a hydrophobic process with respect to a substrate such as a semiconductor wafer, a glass substrate for a liquid crystal display, and the like, and relates to its apparatus, and a resist pattern forming system.

2. Description of the Related Art

A mask for forming a circuit pattern on a surface of a semiconductor wafer (hereinafter referred to as a wafer) or an LCD substrate can be obtained in such a way that the surface of the substrate such as wafer is coated with a photoresist solution (hereinafter referred to as a resist), and the resist-coated surface is subjected to irradiation such light, and a developing process. In order to prevent a resist mask from being peeled off the substrate at the time of a developing step, ion implantation thereafter or etching, it is important to improve adhesion between the substrate and the resist.

For this reason, for example, the surface of the substrate is subjected to the hydrophobic process before being coated with the resist. The hydrophobic process is that the substrate is put in an airtight container and a hydrophobic process gas of HMDS (hexamethyldisilazane:$(CH_3)_3SiNHSi(CH_3)_3$) vapor is supplied into the airtight container to be brought in contact with the substrate while the substrate is held heated at about 90 to 100° C. Hydrophobic nature of the surface of the substrate is thus enhanced whereby improving adhesion between the substrate and the resist.

In order to improve adhesion between the substrate and the resist, it is necessary to judge the corresponding adhesion by some way. In conventional, the hydrophobic (or hydrophilic) nature of the surface of the substrate before being subjected to the resist coating was generally measured to judge the corresponding adhesion. As a method for judging the hydrophobic nature, there is a method in which a contact angle of a drop of water dropped on the surface of the substrate is measured as an index of the hydrophobic nature. The contact angle refers to an angle obtained by doubling the angle, which a line connecting a top portion of the water droplet on the substrate of a target object to an outer periphery of the droplet onto the surface forms with the surface. Hydrophobic process conditions are adjusted based on the value of the contact angle thus obtained so as to improve the adhesion. However, the method for examining the hydrophobic nature of the substrate using the above-mentioned measurement of the contact angle has the following problem.

More specifically, the drop of water must be dropped onto the surface of the substrate, serving as a non-measuring object, in order to measure the contact angle. There is a case in which organic contaminants are put on the substrate and the contact angle of only the corresponding portion increases, with the result that it is judged that the apparent hydrophobic process is performed to the substrate. Even in this case, the substrate does not undergo a silylation reaction in some cases. The same is applied to the performance of an over-silylation process. In such a case, predetermined adhesion strength of the substrate cannot be obtained, and this causes a pattern peeling, so that hydrophobic optimization cannot be performed.

SUMMARY OF THE INVENTION

An object of the present invention is to provide a technique in which a hydrophobic nature of the corresponding surface of the substrate can be examined with high reliability by measuring an amount of hydrophobic process gas on the surface of the substrate.

In order to attain the above object, according to the first aspect of the present invention, there is provided an evaluating method of a hydrophobic process state of a hydrophobic process section in a resist pattern forming apparatus having the hydrophobic process section for supplying a hydrophobic process gas to a surface of a substrate to provide a hydrophobic process to the corresponding surface thereof, a coating process section for coating the surface of the substrate with a resist, and a developing process section for supplying a developing solution to the surface of the substrate subjected to exposure to light, the method comprising the steps of: transferring the substrate subjected to the hydrophobic process by the hydrophobic process section to an analyzing section; and detecting components of the hydrophobic process gas on the surface of the substrate subjected to the hydrophobic process at the analyzing section, whereby performing measurement of a relative detection value of the hydrophobic process gas on the surface of the substrate.

According to this method, since the components of the hydrophobic process gas on the surface of the substrate is analyzed, measurement of hydroscopic gas on the surface of the substrate can be performed without having an influence of organic material adhered to the surface of the substrate during the transfer. Also, the hydrophobic process state can be evaluated accurately. Accordingly, for example, it is possible to adopt the correlation data having high reliability between the quantity of the hydrophobic process gas on the surface of the substrate and the adhesion of the resist pattern formed on the surface of the substrate. It is also possible to set the appropriate hydrophobic process conditions based on this relationship.

The transferring step preferably transfers the substrate subjected to the hydrophobic process to the analyzing section from the resist pattern forming apparatus in a state that the substrate is contained in an airtight container. In this case, the contaminants on the surface of the substrate during the transfer can be suppressed and the hydrophobic process state can be grasped more accurately.

According to the second aspect of the present invention, there is provided a resist pattern forming method comprising the steps of: supplying a hydrophobic process gas to a surface of a substrate to perform a hydrophobic process to the corresponding surface; coating the surface of the substrate with a resist; supplying a developing solution to the surface of the substrate subjected to exposure to light to perform developing; detecting components of the hydrophobic process gas on the surface of the substrate subjected to the hydrophobic process, whereby performing measurement of a relative detection value of the hydrophobic process gas on the surface of the substrate; and comparing a measurement result of the quantity of the hydrophobic process gas with a reference quantity of a preset quantity of the hydrophobic process gas.

According to this method, since the hydrophobic process state is monitored, it is possible to take appropriate treatments immediately when the hydrophobic process state deteriorates.

According to the third aspect of the present invention, there is provided a resist pattern forming system comprising:

a hydrophobic process section for supplying a hydrophobic process gas to a surface of a substrate to perform a hydrophobic process to the corresponding surface thereof; a coating process section for coating the surface of the substrate subjected to the hydrophobic process by the hydrophobic process section with a resist; a developing process section for supplying a developing solution to the surface of the substrate, which is coated with the resist by the coating process section and which is subjected to exposure to light, to perform developing; and an analyzing section for detecting components of the hydrophobic process gas on the surface of the substrate subjected to the hydrophobic process by the coating process section, whereby performing measurement of a relative detection value of the hydrophobic process gas of the surface of the substrate.

These objects, other objects and advantages of the present invention will become readily apparent by the following description and the accompanying drawings.

DETAILED DESCRIPTION OF THE PREFERRED EMBODIMENT

The following will specifically explain a preferred embodiment of a resist pattern forming system for carrying out an evaluating method of a hydrophobic process and a resist pattern forming method according to the present invention with reference to the accompanying drawings.

Figure 1:
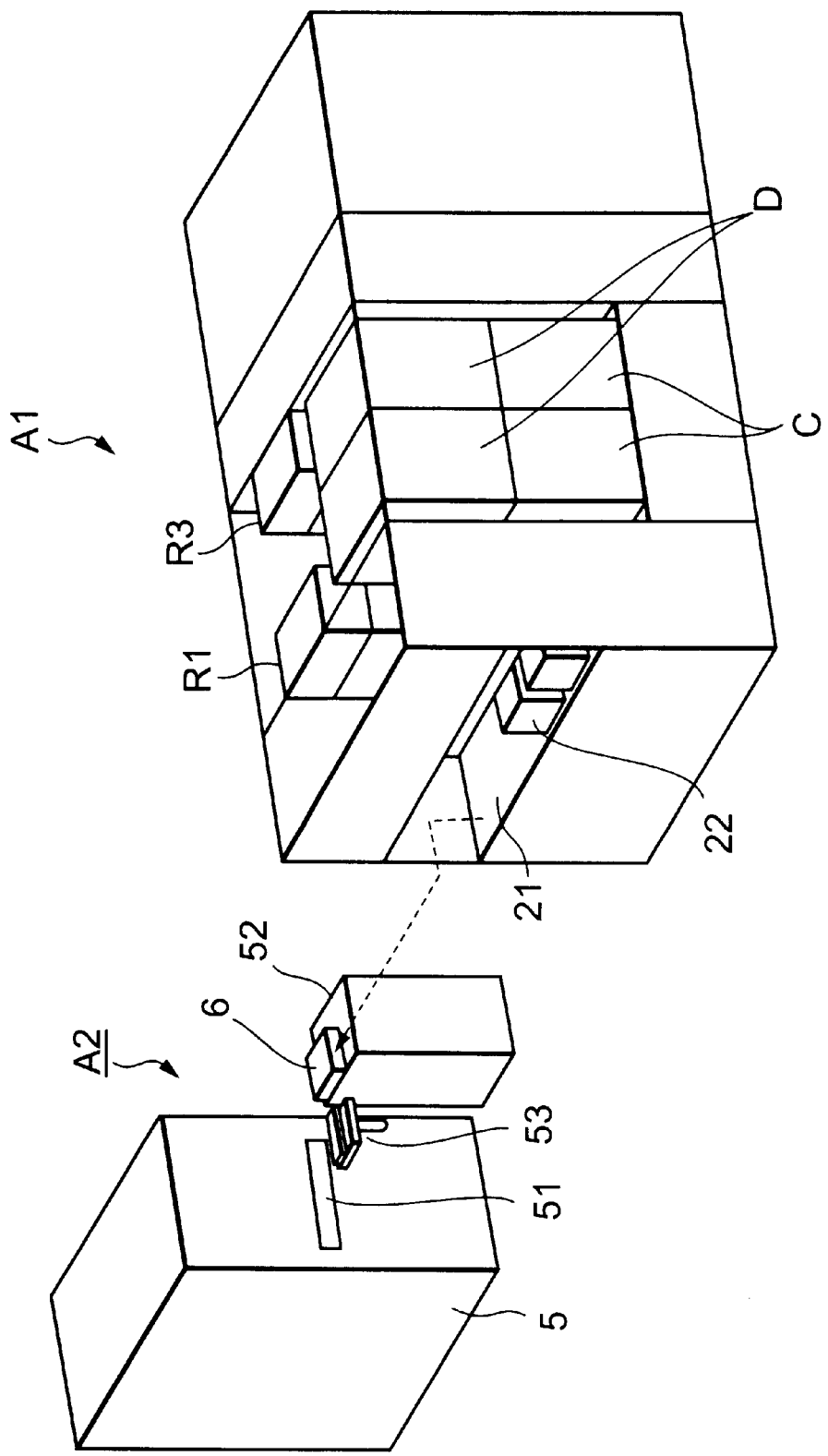
FIG. 1 is a perspective view illustrating the general structure of a resist pattern forming system according to one embodiment of the present invention.
Figure 2:
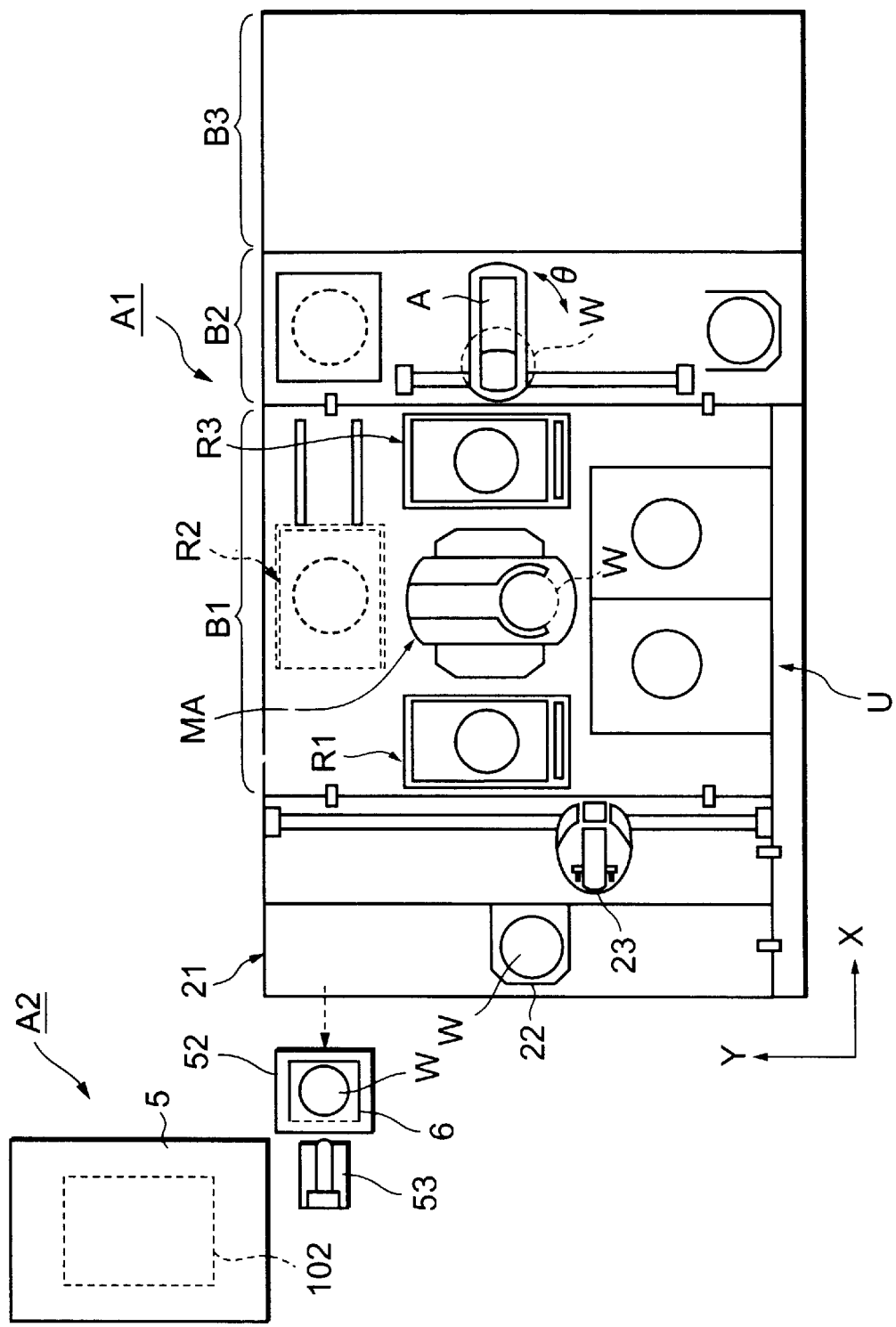
FIG. 2 is a plane view of the resist pattern forming system illustrated in FIG. 1.

The system used in this embodiment comprises a resist pattern forming apparatus A1 and an analyzer A2 for analyzing a hydrophobic state of a hydrophobic processing section provided in the pattern forming apparatus A1 as illustrated in FIGS. 1 and 2.

First, the pattern forming apparatus A1 will be explained. In FIG. 1, reference numeral 21 denotes a cassette loading/unloading stage for loading/unloading a cassette 22 containing a plurality of substrates, for example, twenty-five wafers W, and a delivery arm 23 for taking wafers W out of the cassette 22 is provided to the cassette loading/unloading stage 21. The delivery arm 23 is structured to be movable up and down and in X and Y directions, and rotatable about a vertical axis.

At the inner part of the cassette loading/unloading stage 21, for example, a coating/developing system unit is provided at the right side seeing the inner part from the cassette loading/unloading stage 21, and three shelf units R1, R2, and R3 are provided at the front side, left side, and inner side, respectively. Also, a substrate transferring apparatus MA for delivering the wafer W between the coating/developing system unit U and the shelf units R1, R2, R3 is provided. The substrate transferring apparatus MA is structured to be movable back and fourth, and rotatable about the vertical axis, and movable up and down. It is noted that the shelf unit R2 and the substrate transferring apparatus MA are not illustrated in FIG. 1 for the sake of expediency.

In the coating/developing system unit U, a developing unit D that forms two develop processing sections is provided at the upper stage and a coating unit C that forms two coat processing sections is provided at the lower stage.

Figure 3:
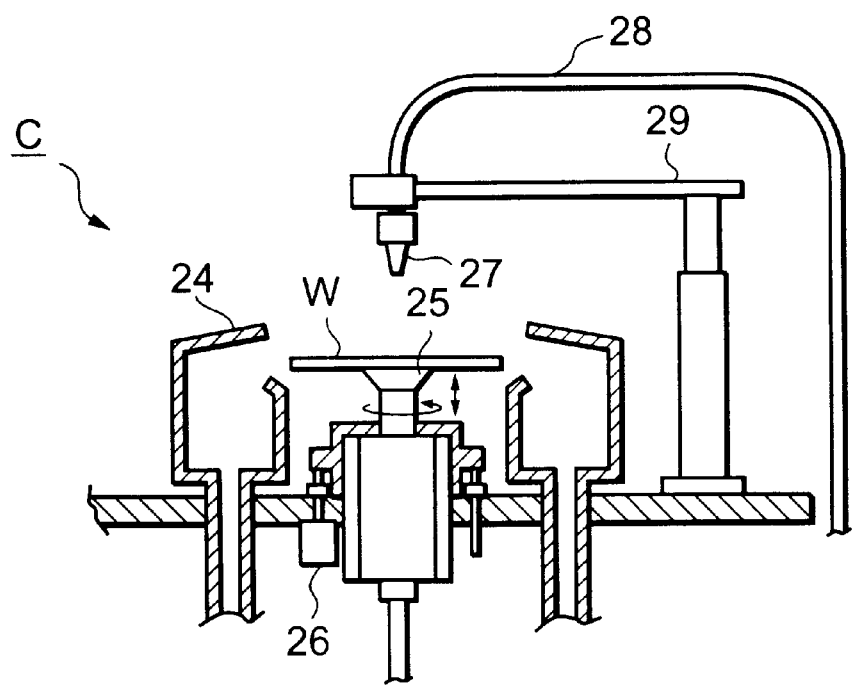
FIG. 3 is a side view illustrating one example of a coating unit in the resist pattern forming system illustrated in FIG. 1.

Herein, an explanation will be given of the coating unit C with reference to, for example, FIG. 3.

Reference numeral 24 denotes a cup, and a rotatable spin chuck 25 with a vacuum absorbing function is provided in the cup 24. The spin chuck 25 is structured to be moved up and down by an elevator mechanism 26. When the spin chuck 25 is positioned at the upper side of the cup 24, the delivery of the wafer W is carried out between the arm of the substrate transferring apparatus MA and the spin chuck 25.

Reference numeral 27 denotes an injection nozzle for a resist liquid, 28: a supply pipe for a resist liquid, and 29: a support arm for moving the nozzle horizontally. The injection nozzle 27 is structured in such a way as to supply the resist liquid to the substantially central portion of the wafer W. Namely, the resist liquid is dropped onto the surface of the wafer W on the spin chuck 25 from the injection nozzle 27, and the spin chuck 25 is rotated to expand the resist liquid onto the wafer W to be coated.

Figure 4:
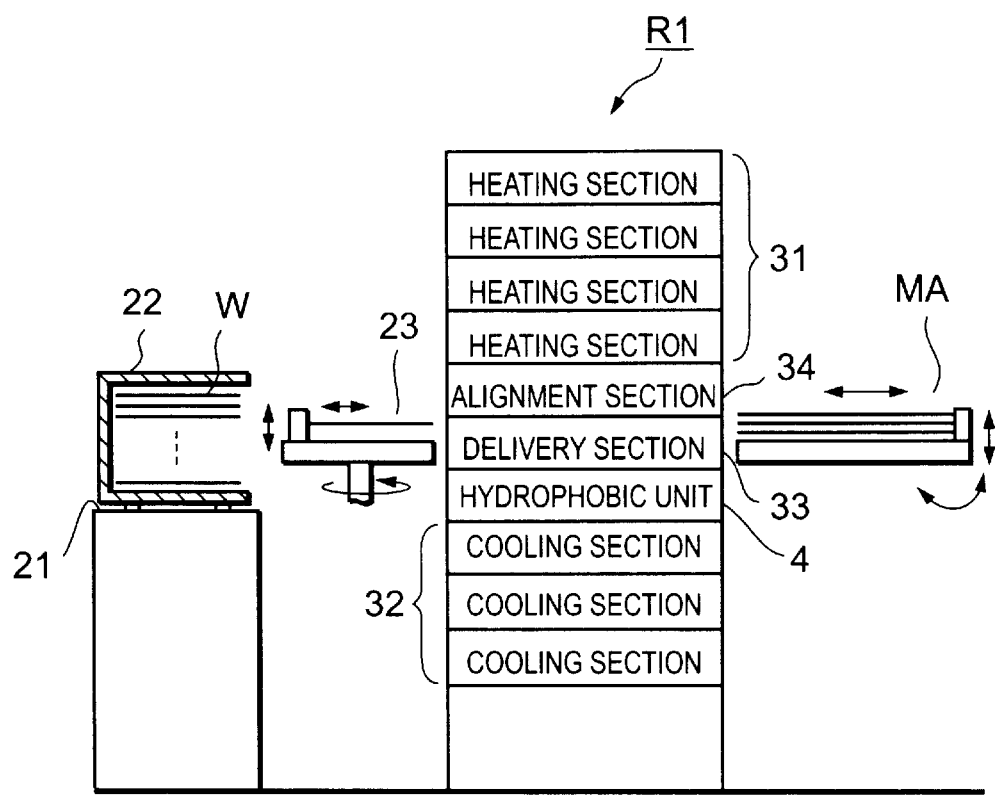
FIG. 4 is a side view illustrating one example of a shelf unit in the resist pattern forming system illustrated in FIG. 1.

Though the developing unit D is substantially the same as that of the coating unit D, the injection nozzle 27 is structured to have numerous supply holes arranged in, for example, the diameter direction of the wafer W. Namely, a developing solution is injected from the injection nozzle 27 to the surface of the wafer W on the spin chuck 25, and the spin chuck 25 is half turned to mount the developing solution on the wafer W, whereby forming a liquid film of the developing solution. Regarding the shelf units R1, R2, and R3, for example, as in the shelf unit R1 illustrated in FIG. 4, heating sections 31 for heating the wafer W, cooling sections 32 for cooling the wafer W, a hydrophobic unit 4 forming a hydrophobic processing section for providing a hydrophobic process to the wafer surface, a delivery section 33, and an alignment section 34 for positioning the wafer W in the shelf unit R1 are arranged in a vertical direction. The delivery section 33 has a delivery table for performing the delivery of the wafer W between the delivery arm 23 and the substrate transferring apparatus MA at the shelf unit R1, and the delivery of wafer W between a transfer arm A of an interface unit B2 described later and the substrate transferring apparatus MA at the shelf unit R3.

Figure 5:
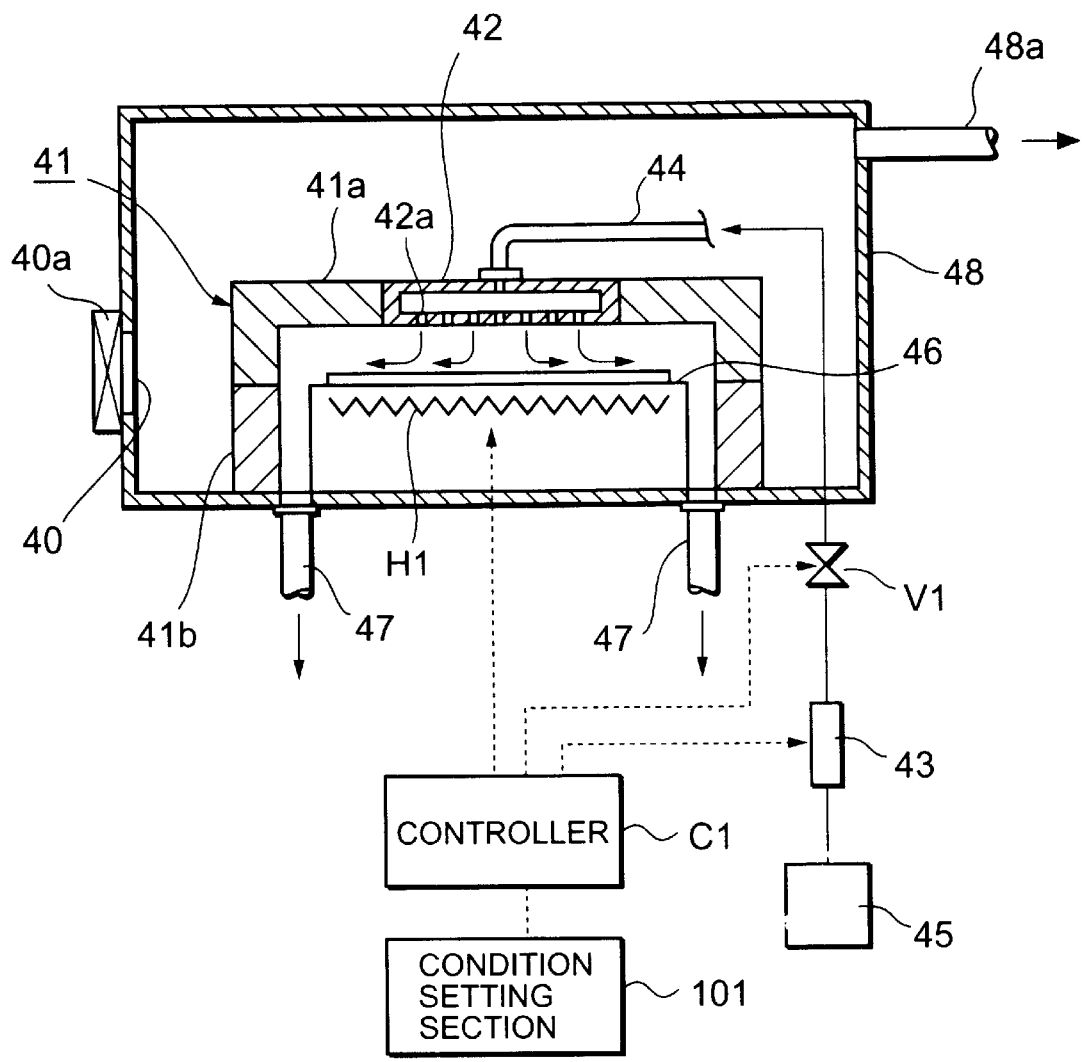
FIG. 5 is a cross-sectional view illustrating one example of a hydrophobic unit in the resist pattern forming system illustrated in FIG. 4.

Sequentially, an explanation of the main parts of the hydrophobic unit 4 will be briefly given with reference to FIG. 5. Reference numeral 41 denotes an airtight container composed of a cover member 41a and a lower container 41b. The cover member 41a is structured to be movable up and down by an elevator mechanism (not shown). The cover member 41a is provided with a gas supply section 42 having numerous supply holes 42a on the lower surface. The gas supply section 42 is formed of, for example, a flexible pipe, and is connected to, e.g., a gas supply source 45 via a gas supply pipe 44 through which a valve V1 and a flow rate control section 43 are provided.

In the lower container 41b, a wafer mounting table 46 in which a heater H1 as a heating section is buried is provided, and an exhaust path 47 is formed therearound. The airtight container 41 is covered with a cover member 48. The cover member 48 has a transfer port 40 for a wafer W that is opened/closed by a shutter 40a and an exhaust pipe 48a is connected thereto. In this case, the valve V1, flow rate control section 43, and heater H1 are controllable by a controller C1, respectively, and a condition setting section 101 such as a keyboard and the like is connected to the controller C1.

In the hydrophobic unit 4, the cover member 41a rises, and the wafer W is mounted on the wafer mounting table 46 via the transfer port 40. Then, the transfer port 40 is closed by the shutter 40a, the cover 41a is also closed, and furthermore e.g., the valve V1 is opened. This supplies a hydrophobic process gas, for example, HMDS gas to the surface of the wafer W from the gas supply section 42, to remove water from the corresponding surface. At this time, the flow rate of the hydrophobic process gas is controlled to a given flow rate by the flow rate control section 43 based on a control signal from the controller C1. A heating temperature of heater H1 is controlled to reach a given temperature by the controller C1. Then, time during which the valve V1 is opened, that is, time during which the hydrophobic process is performed is preset by the condition setting section. After passing this time, the valve V1 is closed based on the control signal from the controller C1.

Given that the portion where the coating/developing unit U is provided is referred to as a processing block B1 as illustrated in FIG. 1. The processing block B1 is connected to an exposure block B3 via the interface unit B2. The interface unit B2 performs the delivery of the wafer W between the processing block B1 and the exposure block B3 by the transfer arm A, which is movable up/down, right/left, and back/forth, and which is rotatable about a vertical axis.

An explanation will be next given of the analyzer A2. The analyzer A2 is provided close to the resist pattern forming apparatus A1, and has an analyzing section 102, which is composed of a TOF-SIMS (Time of Flight Secondary Ion Mass Spectrometer) and which is provided in a housing 5 with a wafer transfer port 51. Namely, the analyzer A2 is structured in such a way as to measure the HMDS quantity on the surface of the wafer W transferred on the mounting table (not shown) via the wafer transfer port 51.

At the position facing the analyzer A2, there is provided a mounting table 52 of an airtight container 6 described later. There is also provided a delivery arm 53, which is movable back/forth and up/down and which is rotatable about the vertical axis, in such a way that the delivery of the wafer W is performed between the airtight container 6 mounted on the mounting table 52 and the analyzer 102.

Figure 6:
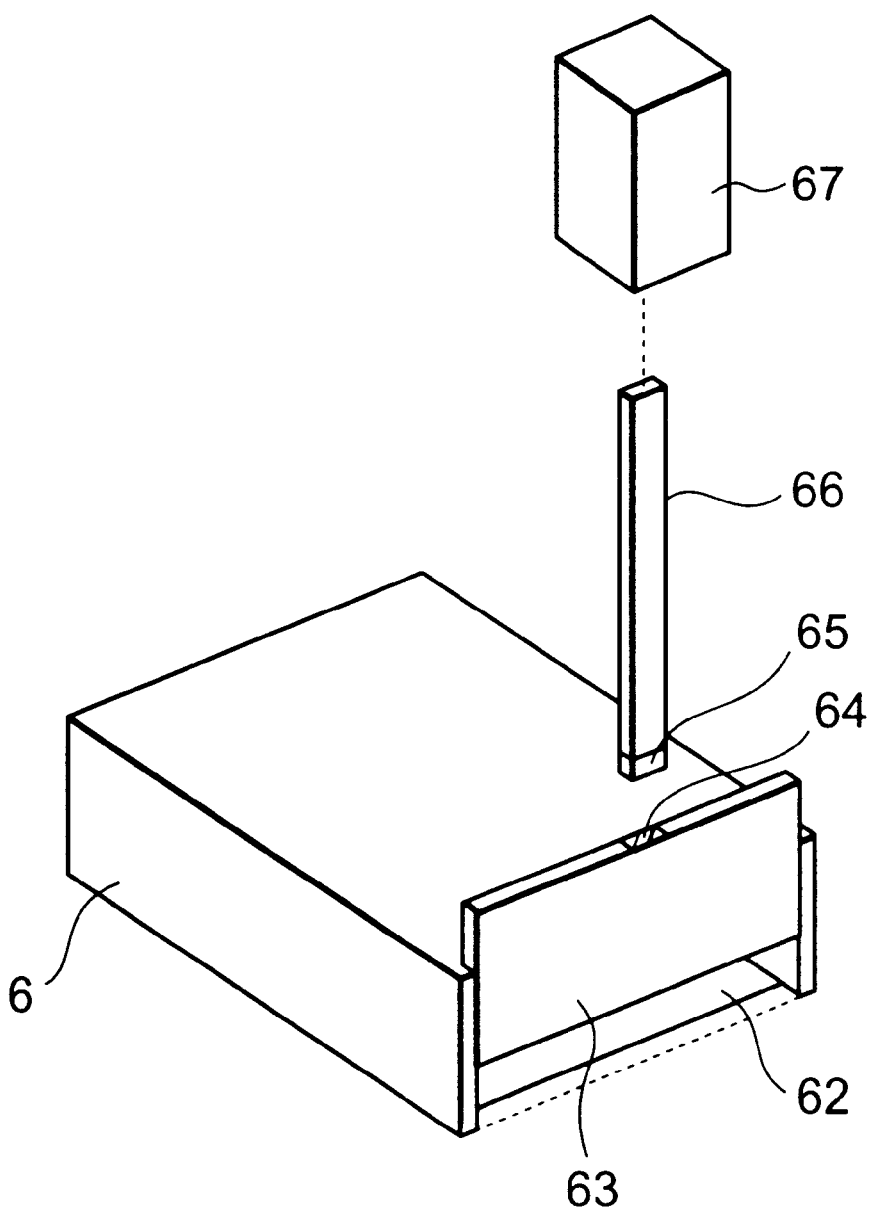
FIG. 6 is a perspective view illustrating an airtight container for containing a substrate.

Herein, an explanation will be given of the airtight container 6 with reference to FIGS. 6 and 7. The container 6 is structured in such a way as to contain, for example, one wafer W. In the interior thereof, projections 61 are formed at a plurality of positions, which do not interfere with the delivery arm 53. This holds a plurality of positions of the rear face of the wafer W.

One surface of the side portion, for example, of the container 6 is opened as a delivery port 62 for the wafer W. The delivery port 62 is structured to be freely opened/closed by a cover section 63 that slides up and down along a rail (not shown) provided at, for example, a side wall. This closes the corresponding container 62 airtightly when the cover portion 63 is closed. In this case, for example, a magnet 64 is fixed onto the upper edge of the cover portion 63, and an elevator rod 66 having an electromagnet 65 on its lower end is moved up and down by an elevator mechanism 67. This moves the cover portion 63 up and down to open/close the delivery port 62.

Namely, at the time of opening the delivery port 62, the electromagnet 65 is turned on to attract the electromagnet 65 of the elevator rod 66 and the magnet 64 of the cover portion 62. In this state, the elevator rod 66 is moved up, so that the cover portion 62 is pulled up by a magnetic force. While, at the time of closing the delivery port 62, the elevator rod 66 is moved down in the state that the electromagnet 65 and the magnet 64 are attracted. After the cover portion 63 closes the delivery port 62, the electromagnet 65 is turned off, with the result that the delivery port 62 is closed by the cover portion 63.

Figure 7:
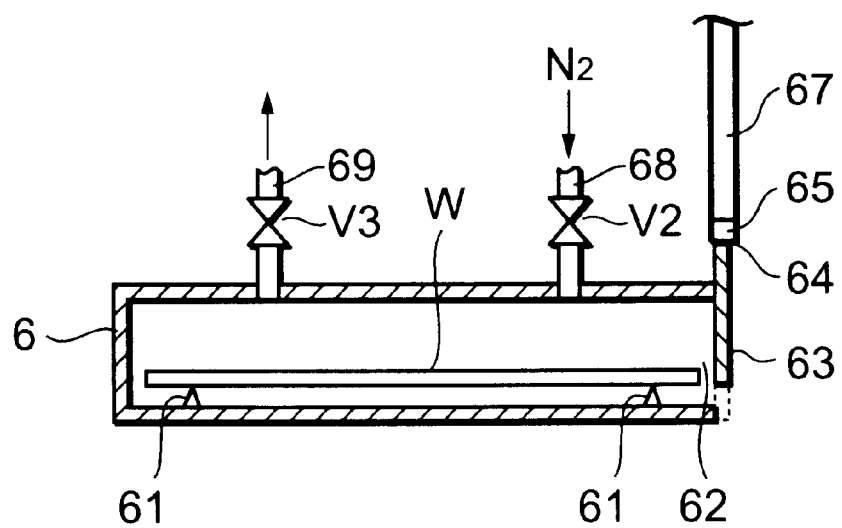
FIG. 7 is a cross-sectional view of the airtight container illustrated in FIG. 6.

The airtight container 6 has a gas introduction pipe 68 for introducing an inactive gas such as nitrogen gas to the container 6 and an exhaust pipe 69 for exhausting the container 6 as illustrated in FIG. 7. In the figure, V2 and V3 are open/close valves. After the delivery port 62 is closed to make the container 6 airtight, the valves V2 and V3 are opened to introduce the nitrogen gas to the container 6 and to substitute nitrogen for the atmosphere of the corresponding container 6. Thereafter, the valves V2 and V3 are closed, so that the nitrogen gas can be sealed in the corresponding container 6.

The airtight container 6 is mounted on, for example, the cassette stage 21 in such a manner that the delivery port 62 is directed to the delivery arm 23. The open/close mechanism composed of the elevator rod 66 and the elevator mechanism 67 is provided at, for example, the upper side of the cassette stage 21 and the upper side of the mounting table 52 of the analyzer Al.

Sequentially, an explanation will be given of the analyzing section 102. SIMS refers to a method that irradiates a test sample with a primary ion such as Ga (gallium) to detect mass of a secondary ion generated from the test sample irradiated. Particularly, TOF-SIMS uses the point that the velocity of the secondary ion differs depending on mass. Namely, TOF-SIMS is a method in which time of flight (TOF), which has elapsed before the secondary ion enters a detector after passing through a flight pipe with a fixed length, is automatically converted into mass, whereby obtaining a mass spectrum.

More specifically, the wafer W on the mounting table of the analyzing section 102 is irradiated with the primary ion such as Ga, and the mass of ionic species generated by this if irradiation such as $C_3H_9Si^+$ (rational formula: $(CH_3)_3Si^+$), $C_3H_9OSi^-$ (rational formula: $(CH_3)_3OSi^-$), $C_3H_9SiNH^+$ (rational formula: $(CH_3)_3SiNH^+$)), and the like are measured. This method makes it possible to analyze the surface of the wafer W since the wafer W is irradiated with the primary ion pulsed. Also, this method makes it possible to measure the detected quantity of each component originated from HMDS since the detection is made in a state that a molecular structure is maintained to some degree. In other words, the ionic species such as $C_3H_9Si^+$ and the like are the parts of the molecular structure of HMDS (($CH_3)_3SiNHSi (CH_3)_3$), and their concentration is proportional to concentration of HMDS. Accordingly, measurement of the quantity of ionic species allows measurement of the quantity of HMDS on the surface of the wafer W.

The following will describe the examples of experiments that have been performed to confirm that measurement of the quantity of HMDS on the surface of the wafer W using the method of the present invention is efficient.

Figure 8:
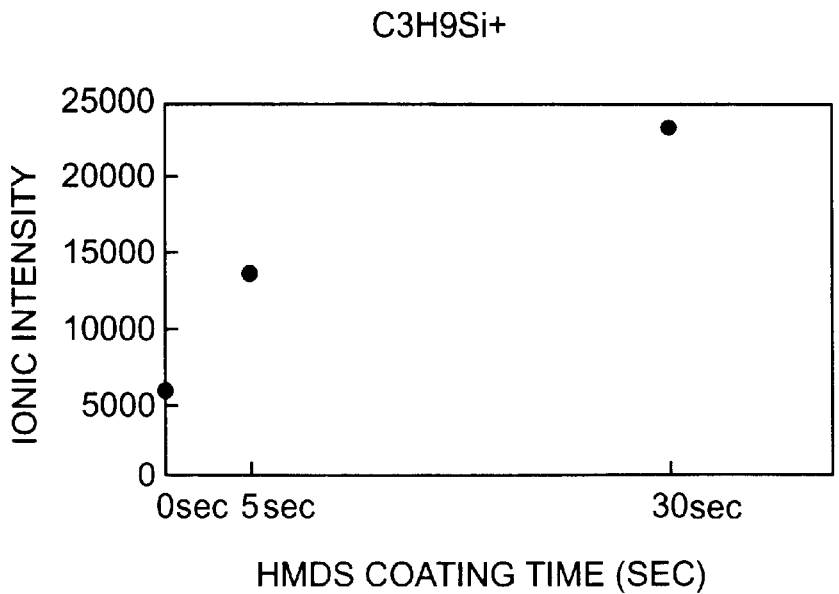
FIG. 8 is a characteristic view (No.1) showing a measuring result of a HMDS quantity on a surface of a wafer using a TOF-SIMS.
Figure 9:
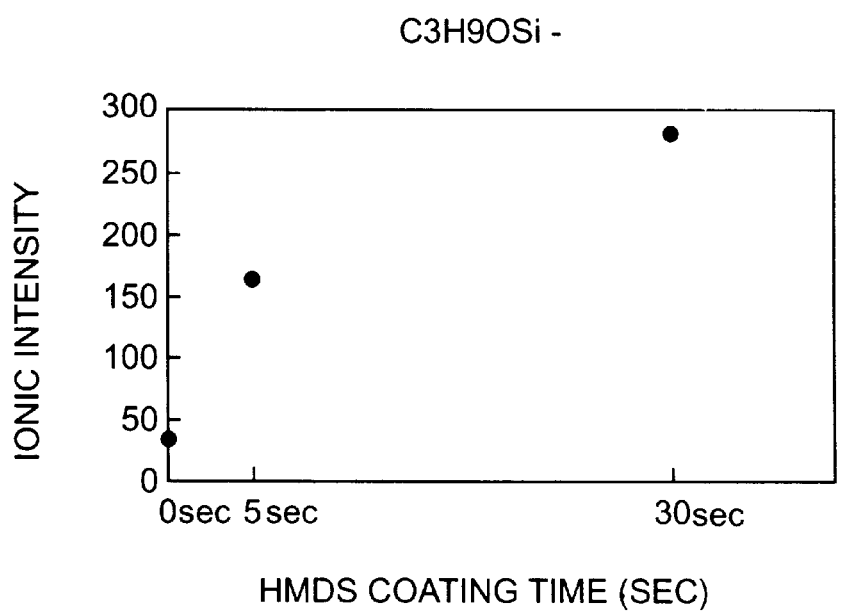
FIG. 9 is a characteristic view (No.2) showing a measuring result of a HMDS quantity on a surface of a wafer using a TOF-SIMS.

FIGS. 8 and 9 are characteristic views showing the relationship between HMDS coating time (hydrophobic processing time) and ionic intensity of an ionic species when quantification of a specific ionic species is performed to the wafer W subjected to the hydrophobic process using TOF-SIMS.

The conditions for the hydrophobic process were set as follows:

More specifically, temperature of wafer W (heating temperature for heater H1) was 90° C. The flow rate of HMDS gas was 4 lit/mm. Processing time was changed to 0 sec (a case where coating of HMDS was not performed), 5 seconds, 30 seconds, and the specific ionic species was measured using TOF-SIMS in each case. The specific ionic species to be analyzed were $C_3H_9Si^+$, and $C_3H_9OSi^-$.

FIG. 8 shows the characteristic view of $C_3H_9Si^+$ and FIG. 9 shows the characteristic view of $C_3H_9OSi^-$. In these characteristic views, a vertical axis shows ionic intensity. This indicates that the quantity of ionic species increases with an increase in intensity. In either figure, the longer the processing time, the higher the ionic intensity becomes, and the gradient is substantially the same as each other. Accordingly, it is clear that measurement of these specific ionic species makes it possible to measure HMDS on the wafer W accurately.

In this case, among specific ionic species, data of any one of ionic species may be used to measure HMDS quantity or some or all of data of specific ionic species may be combined to measure HMDS quantity. Moreover, in the case of quantifying HMDS, the sample of the known concentration is analyzed and calculation of concentration may be performed based on the analytical result.

As mentioned above, this embodiment performs measurement of HMDS quantity on the surface of the wafer W subjected to the hydrophobic process to examine the state of the hydrophobic process. One of reasons why measurement of HMDS quantity is thus performed is to examine a correlation between the HMDS quantity on the surface of the wafer W and the adhesion of the resist pattern. The inventors of the present invention have grasped the point that there is a predetermined correlation between the HMDS quantity on the surface of the wafer W and the adhesion of the resist pattern, and the adhesion of the resist pattern increases when the concentration of HMDS on the surface of the wafer W is a given value.

The following will explain the case of examining the correlation between the HMDS quantity on the surface of the wafer W and the adhesion of the resist pattern at the time of setting up the apparatus.

More specifically, one wafer W for inspection and the cassette 22, which contains twenty-five wafers W for processing, are carried onto the cassette stage 21 by an automatic transferring robot (or an operator). The wafer W is taken out of the cassette 22 by the delivery arm 23, and is put on the delivery section 33 of the shelf unit R1 of a process station S2. Next, the wafer W is transferred to the hydrophobic unit 4 of the shelf unit R by the substrate transferring apparatus MA, and the transferred wafer W is subjected to the hydrophobic process as mentioned above. Thereafter, the wafer W subjected to the hydrophobic process is transferred to the cooling section 32 of the shelf unit R, and is cooled to a given temperature, for example, 23° C.

Then, the wafer W for inspection is carried into the interior of the airtight container 6 mounted on the cassette stage 21 by the delivery arm 23. After that, the cover portion 63 is closed to make the container 6 airtight, and the nitrogen gas is sealed in the corresponding container 6 as mentioned above. Thereafter, the airtight container 6 is transferred onto the mounting table 52 of the analyzer A2 by the automatic transferring robot (not shown), and is carried to the analyzing section 102 through the wafer transfer port 51 by the delivery arm 53. The part or entirety of the delivery of the wafer W between the coating/developing apparatus A1 and the analyzer A2 may be carried out by the operator.

At the analyzing section 102, the HMDS quantity on the surface of the wafer W is quantified automatically by the aforementioned method or manually by the operator. One example of analytical conditions may include primary ionic species: Ga, primary acceleration voltage: 15 kV, primary ionic current: 0.6 nA, and raster region: 100 $\mu m^2$.

On the other hand, the wafer W for processing is transferred to the coating unit C, and is coated with the resist liquid to form a resist film. After that, the wafer W is transferred via a route including heating section 31 of the shelf unit R→cooling section 32→delivery section 33 of the shelf unit R2→transfer arm A of the interface unit B2→exposure apparatus B3. Then, at the exposure apparatus B3, exposure to light is performed through a mask corresponding to the pattern.

The exposed wafer W is transferred to the processing block B1 via a route including exposure apparatus B3→transfer arm A of the interface unit B2 → delivery section 33 of the shelf unit R2. At the processing block G, the wafer W is transferred via a route including heating section 31 of the shelf unit R → cooling section 32→developing unit D. Then, at the developing unit D, the wafer W is subjected to the developing process at a given temperature, for example, 23° C., which is the coating temperature of developing solution, to form a resist pattern. Thereafter, the wafer W is transferred via a route including heating section 31 of the shelf unit R→cooling section 32→delivery section 33 of the shelf unit R1→delivery arm 23. As a result, the wafer W is returned to the original cassette 22. Thereafter, evaluation of the adhesion of resist pattern is performed to the wafer W for processing using, for example, an AFM (Atomic Force Microscope).

Here, in the hydrophobic unit, since the hydrophobic process is performed to the wafer W for inspection and the wafer W for processing under the same condition, the HMDS quantity on the surface of the wafer W for inspection and that of the wafer W for processing are substantially the same. Under various kinds of hydrophobic conditions, the HMDS quantity on the surface of the wafer W for inspection and the adhesion between the resist pattern and the wafer W for processing are examined to collect data thereof. Whereby, making it possible to obtain correlation data therebetween.

According to this embodiment, processing parameters for the hydrophobic process can be optimized by use of the HMDS quantity on the surface of the wafer W and the adhesion of the resist pattern. Namely, as hydrophobic process conditions, processing temperature, supply quantity (flow rate) of HMDS per processing time, degree of vacuum, and the like are given, and a value of one of these parameters or values of two or more parameters are corrected.

More specifically, in the case where the adhesion of the resist pattern is examined and determined as a low adhesion, the hydrophobic process conditions are controlled in such a way as to increase the HMDS quantity on the surface of the wafer W. For example, the flow rate control section is controlled to increase the flow rate of the HMDS gas to be supplied to the surface of the wafer W. Or, the valve V1 is controlled to increase processing time, or both setting values are controlled to review the hydrophobic conditions. Moreover, it is possible to adopt a method in which heating is performed using the heater H1 of the wafer mounting table in order to increase temperature of the surface of the wafer W according to an increase in the flow rate of the HMDS gas.

While, in the case where the adhesion of the resist pattern is determined as a high adhesion, the flow rate of the HMDS gas may be reduced to shorten processing time, contrary to the above-mentioned method in order to decrease the HMDS quantity on the surface of the wafer W.

Furthermore, according to this embodiment, the decision work for hydrophobic processing conditions is ended, and the resist pattern is formed on the actual product wafers W by the pattern forming apparatus A1. At this time, the hydrophobic process is performed to the wafer W pulled out of the product wafers W and the HMDS quantity on the surface of the wafer W is measured, and the measurement result is input to the control section. While, in the control section, there is beforehand inputted the HMDS quantity (reference quantity) on the surface of the wafer W, which can be obtained when the satisfactory hydrophobic process is performed under a certain hydrophobic condition. The measurement result and the reference quantity are compared with each other. Regarding the way to use the comparison result (value obtained by subtracting the quantitative result from the reference quantity), for example, the comparison result is printed out or displayed on the screen and the operator may evaluate the hydrophobic state. Moreover, it is possible to output an estimation result in which the hydrophobic state is good when the comparison result is smaller than a fixed value and bad when it is greater than the fixed value.

Furthermore, according to this embodiment, the control section C1 may control the hydrophobic process condition in such a way as to increase the HMDS on the surface of the wafer W based on the comparison result when the measurement result of the HMDS quantity is smaller than the reference quantity. Also, the control section C1 may control the hydrophobic process conditions in such a way as to reduce the HMDS on the surface of the wafer W when the measurement result of the HMDS quantity is greater than the reference quantity.

In addition, it is possible to know the timing of changing a chemical liquid reserved in the gas supply source 45 by use of the aforementioned correlation data. Namely, when the chemical liquid becomes old, the adhesion of the resist pattern deteriorates and the chemical liquid needs replacing with new chemical liquid. Accordingly, the replacement of chemical liquid may be performed in accordance with the measured HMDS quantity.

According to the aforementioned embodiment, measurement of the HMDS quantity itself on the surface of the wafer W is carried out by measuring the quantity of the specific ionic species using the analyzer such as TOF-SIMS. This makes it possible to make the evaluation of the HMDS quantity on the corresponding surface with high reliability as compared with the method of measuring the contact angle of the drop of water. For this reason, it is possible to adopt accurate correlation data between the HMDS quantity and the adhesion of the resist pattern when the apparatus is set up as mentioned above.

The use of correlation data between the HMDS quantity on the surface of the wafer W and the adhesion of the resist pattern makes it possible to easily optimize the hydrophobic condition for obtaining the adhesion of the predetermined resist pattern at the time of deciding the processing parameters. The hydrophobic process state is periodically examined, so that the adhesion of the resist pattern can be checked. This allows generation of product wafers W with an insufficient adhesion to be monitored.

Moreover, if the hydrophobic process state is examined and the hydrophobic process conditions are automatically controlled based on the examination result, the hydrophobic process conditions can be controlled such that the HDMS quantity on the surface of the wafer W reaches a given quantity immediately. This makes it possible to reduce generation of product wafer W with an insufficient adhesion.

In the aforementioned system, the inspection wafer W subjected to the hydrophobic process is carried onto the dedicated airtight container 6 on the cassette stage, and is directly transferred to the analyzer A2, with the result that measurement of the HMDS quantity can be carried out more accurately. In other words, the wafer W is carried as being contained in the airtight container 6, with the result that adherence of organic materials to the surface of the wafer W during the transfer can be suppressed. This prevents the examination result from being influenced by the organic materials adhered on the surface of the wafer W, and makes it possible to measure the HMDS with high precision. Moreover, the wafer W is transferred in a state that an inactive gas such as nitrogen gas is sealed in the airtight container 6, with the result that adherence of organic materials can be further suppressed.

In the case where a plurality of wafers W is contained in one airtight container, there is a possibility that HMDS contaminants will occur on the wafers W directing to the wafer W with a small HMDS quantity from the wafer W with a large HMDS quantity. Moreover, in the case where the wafers W are contained into a container such as a cassette where the plurality of wafers W is contained one by one, the size of the cassette is large, and a large-scale transfer must be carried out, with the result that a wide mounting location is required. For this reason, it is desirable that such a type of airtight container 6 that contains the wafers W one by one should be used.

The total amount of time required for the transfer in the coating/developing apparatus to contain the wafer W subjected to the hydrophobic process to the airtight container 6 and the transfer between the resist pattern forming apparatus A1 and the analyzer A2 should be desirably within a predetermined time. The reason is as follows:

More specifically, there is a correlation between the transfer time and the HMDS quantity that exerts at the time of transfer. Accordingly, if the transfer time is within the predetermined time, the HMDS quantity that exerts at the time of transfer is substantially uniform, so that measurement of the HMDS can be carried out with high precision. Regarding the predetermined time, it is noted that the detected values of the HMDS original components, which are reduced by leaving them as they are, are examined and the predetermined time is determined based on the examination result.

According to the above embodiment, for example, TDS-API-MS (Thermal Desorption Spectrometry-Atmospheric Pressure Ionization-Mass Spectrometer) can be used as the analyzer, other than TOF-SIMS. TDS-APIMS heats the surface of the wafer W and ionizes a component thermally desorbed from the corresponding surface with corona discharge under atmospheric pressure. Then, TDS-API-MS performs mass spectrometry to measure the quantity of the ionized component. The component thermally desorbed from the corresponding surface can be ionized with corona discharge in a state that the molecular structure is held to some degree. This makes it possible to carry out measurement of the HMDS with high precision.

Herein, the specific component to be measured is a component that has one of mass numbers of 73, 74, 75, 105, 106. In addition, this analysis is performed in the state that the wafer W is heated up to 0 to 800° C. at a programming rate, for example, 10 to 20° C./min.

Figure 10:
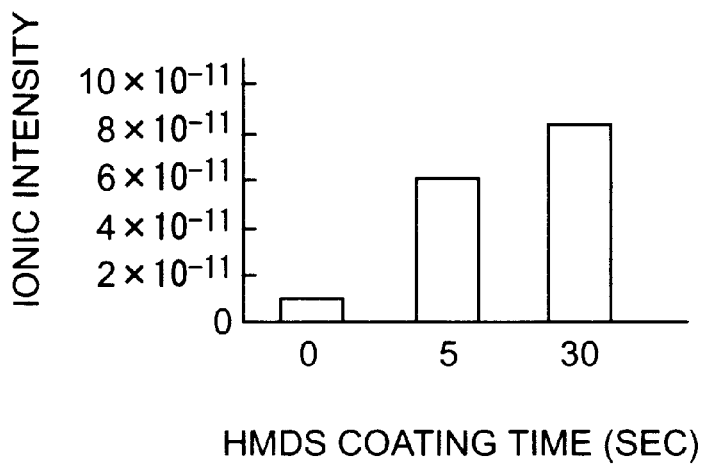
FIG. 10 is a characteristic view (No.1) showing a measuring result of a HMDS quantity on a surface of a wafer using an API-MS.
Figure 11:
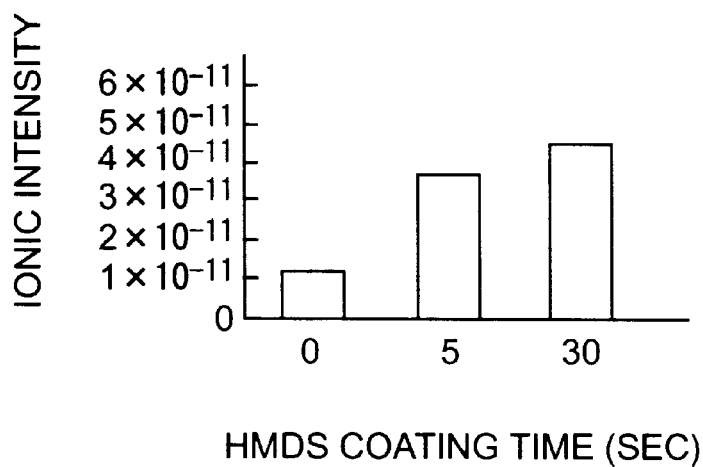
FIG. 11 is a characteristic view (No.2) showing a measuring result of a HMDS quantity on a surface of a wafer using an API-MS.

FIGS. 10 and 11 are characteristic views showing the relationship between HMDS coating time (hydrophobic processing time) and ionic intensity of the measured ionic species when quantification of HMDS is performed to the wafer W subjected to the hydrophobic process using TDS-APIMS.

In this case, the wafer W was dipped in a solution of 0.5w % hydrofluoric acid for two minutes as pretreatment. Then, the surface of the wafer W was washed, and the washed wafer W was subjected to the hydrophobic process. The conditions for the hydrophobic process were set as follows:

More specifically, temperature of wafer W (heating temperature for heater H1) was 90° C. The flow rate of HMDS gas was 4 lit/min. Processing time was changed to 0 sec (a case where coating of HMDS was not performed), 5 seconds, 30 seconds, and the quantification of the specific ionic species was measured using TOF-SIMS in each case. The specific ionic species here referred to the components each having a mass number of 73, and a mass number of 105.

FIG. 10 shows the characteristic view of the component having a mass number of 73 and FIG. 9 shows the characteristic view of the component having a mass number of 105. In these characteristic views, a vertical axis shows ionic intensity. This indicates that the quantity of ionic species increases with an increase in intensity. It is recognized from these figures that the longer the processing time, the higher the ionic intensity of each of these components becomes. The components each having a mass number of 73, and a mass number of 105 are specific species resulting from the presence of HMDS. Accordingly, it is clear that measurement of these specific ionic species makes it possible to estimate the HMDS quantity accurately. It is noted that the component having a mass number of 73 can be regarded as a component of $(CH_3)_3Si$ series.

In the above system, at the time of the transfer via a route including the hydrophobic unit 4 for analytical wafer W provided in the resist pattern forming apparatus A1→cooling section 32→delivery section 33, the transfer may be carried out as supplying gas, which is adjusted to a predetermined atmosphere, to the wafer W in order to suppress contaminants on the surface of the wafer W.

Figure 12:
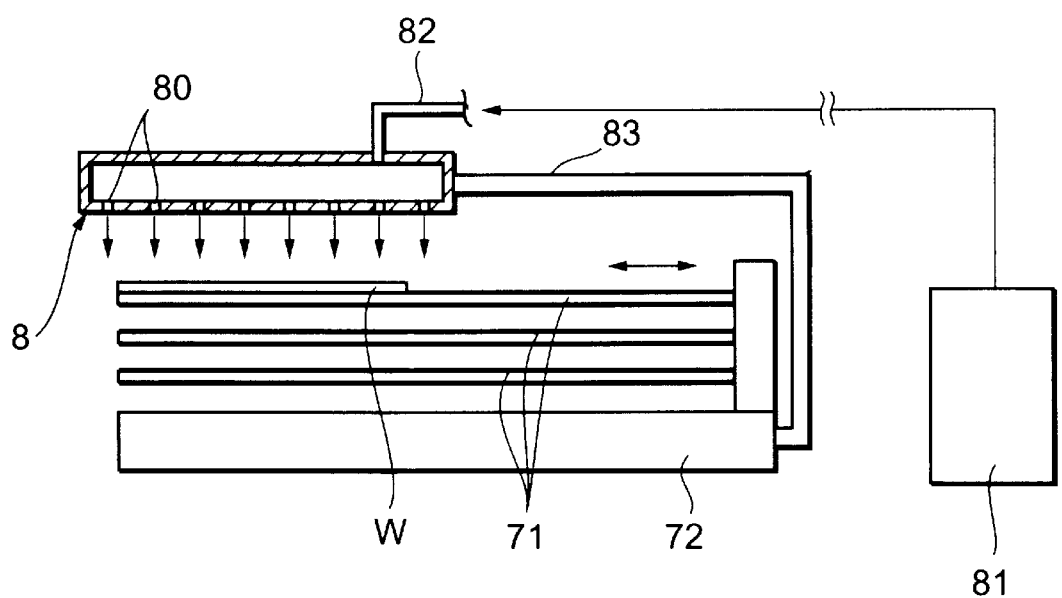
FIG. 12 is a side view illustrating one example of a substrate transferring apparatus according to one embodiment of the present invention.
Figure 13:
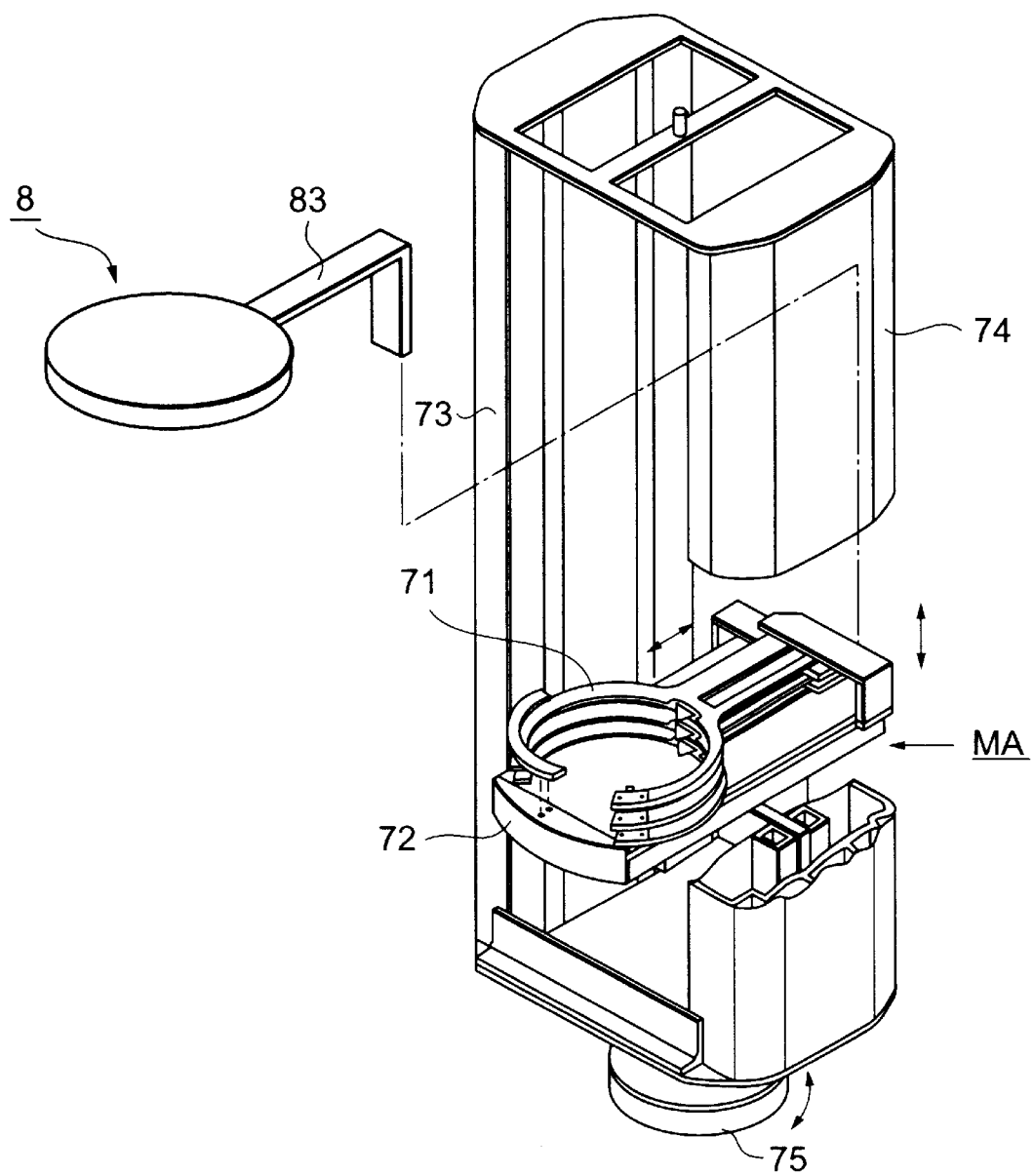
FIG. 13 is a perspective view of the substrate transferring apparatus illustrated in FIG. 12.

Herein, as illustrated in FIGS. 12 and 13, the substrate transferring apparatus MA comprises three arms 71 for holding the wafer W and a base 72 for supporting these arms 71 to be movable back and forth, and a pair of guide rails 73 and 74 for supporting the base 72 to be movable up and down. These guide rails 73 and 74 are rotated by a rotary drive section 75 in such a way that the base 72 is movable back/fourth and up/down, and rotatable about a vertical axis.

Then, in this example, a gas supply section 8 is provided at the upper side of the arm 71 of the uppermost stage. The gas supply section 8 supplies an inactive gas such as nitrogen gas to the wafer W supported by the arms 71. The inactive gas from a gas supply source 81 is designed to be supplied to the wafer W on an arm 91 via a supply pipe 82 and numerous gas supply holes formed in the lower surface of the gas supply section 8. The gas supply section 8 is attached to the back surface of the base 72 (back surface in the advancing direction of the arms 71) by, for example, a support arm 83.

According to this embodiment, the inactive gas is supplied to the surface of the wafer W at the time of transferring the wafer W subjected to the hydrophobic process. This makes it possible to suppress the contaminants on the surface of wafer W at the transferring time, and to measure the HMDS quantity on the surface of the wafer W at higher precision.

Regarding the delivery arms 23, 53, and the like, there may be provided a gas supply section for supplying an inactive gas to the surface of the wafer W on the arm, similar to the substrate transferring apparatus MA. Then, the analytical wafer W may be transferred to the analyzer A2 via a route including delivery section 33→the airtight container 6 of the cassette stage 21 as supplying the inactive gas to the surface of the wafer W. In this case, the contaminants on the surface of wafer W at the transferring time can be further suppressed. In the aforementioned cases, the gas supply section 8 does not have to be fixed to the substrate transferring apparatus MA as one body. Instead, the gas supply section 8 may be separately provided in such a way that gas can be supplied to the wafer W supported by the arms 71.

Furthermore, according to the present invention, the airtight container 6, which is used to transfer the wafer W from the resist pattern forming apparatus A1 to the analyzer A2, is not limited to the type of container that contains the wafers W one by one as in the aforementioned embodiment. It is possible to use a close-type cassette having a structure in which a cassette opening portion is opened/closed by a cover portion or a contaminants prevention cassette in which chemical materials are moved by a built-in filter. Still furthermore, according to the present invention, as a hydrophobic process gas used in the hydrophobic process, there may be used IPTMS (Isopropenoxy Trimethyl Silane) or ATMA (Acetoxy Trimethyl Silane) and the like other than HMDS gas. The substrate may be a glass substrate for a liquid crystal display without being limited to the wafer.

Figure 14:
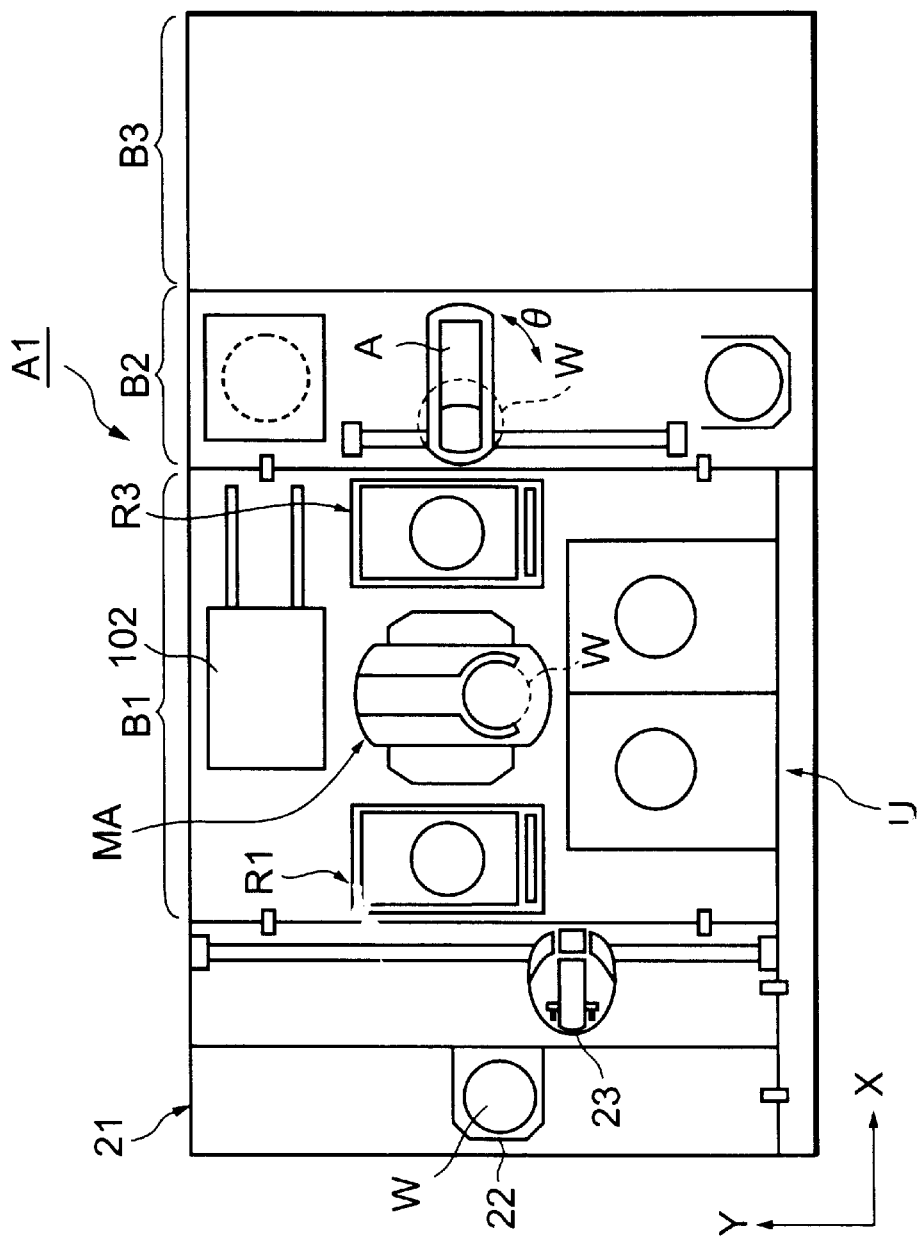
FIG. 14 is a plane view of the resist pattern forming system according to another embodiment of the present invention.
Figure 15:
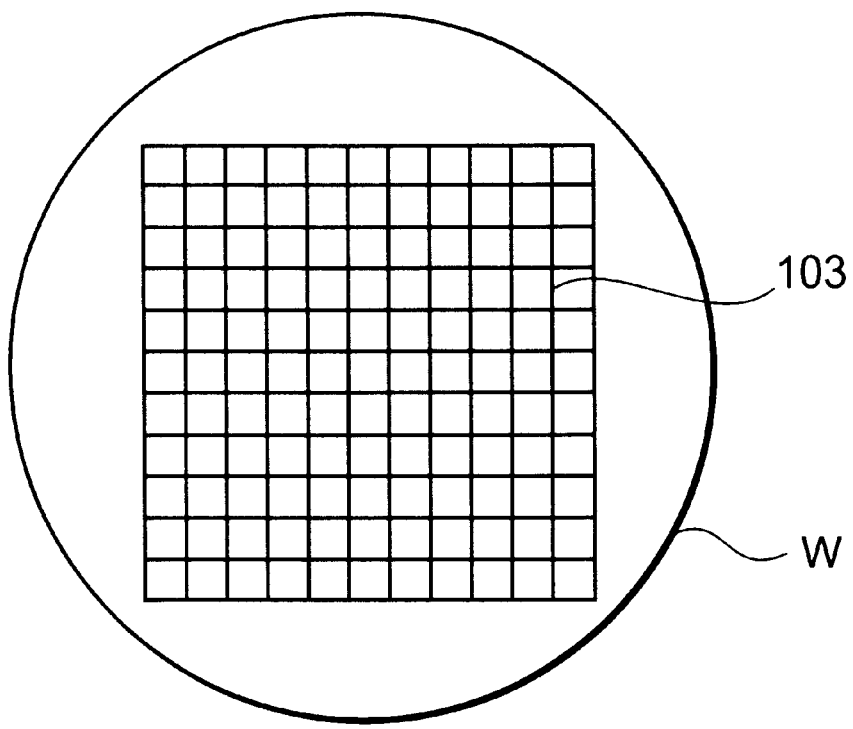
FIG. 15 is a view explaining one example of an ion irradiation method at an analyzing section according to the present invention.

Still, furthermore, in the aforementioned embodiment, the resist pattern forming apparatus A1 and the analyzer A2 are separated from each other. However, for example, as illustrated in FIG. 14, there may be used a unit structure in which the analyzing section 102 is provided in the resist pattern forming apparatus A1, to combine the resist pattern forming apparatus and the analyzer with each other. In this case, there is a possibility that the product wafer W will be also irradiated with the primary ion such as Ga (gallium) at the analyzing section 102. In such a case, irradiation of such an ion onto a region out of the product wafer W such as a scribe line 103 makes it possible to avoid an adverse influence upon the product wafer W.

As explained above, according to the present invention, measurement of the hydrophobic process gas on the surface of the substrate makes it possible to evaluate the hydrophobic process state with high reliability. For example, correlation data between the HMDS quantity on the surface of the substrate and the adhesion of the resist pattern formed on the substrate can be obtained with high accuracy.

The disclosure of Japanese Patent Application No. 2000-106515 filed Apr. 7, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An evaluating method of a hydrophobic process state of a hydrophobic process section in a resist pattern forming apparatus having said hydrophobic process section for supplying a hydrophobic process gas to a surface of a substrate to provide a hydrophobic process to the corresponding surface thereof, a coating process section for coating the surface of said substrate with a resist, and a developing process section for supplying a developing solution to the surface of the substrate subjected to exposure to light, said method comprising the steps of:

analyzing a quantity of an ionic species in a sample hydrophobic process gas of a known concentration previously;

transferring the substrate subjected to the hydrophobic process by said hydrophobic process section to an analyzing section;

detecting quantity of the ionic species of the hydrophobic process gas on the surface of the substrate subjected to the hydrophobic process at said analyzing section;

evaluating the hydrophobic process state by comparing the analyzed result with the detected result; and adjusting a process condition of the hydrophobic process based on the result of the evaluation.

2. The method according to claim 1, wherein said hydrophobic process gas is hexamethyldisilazane.

3. The method according to claim 1, wherein said analyzing section provides energy to the hydrophobic process gas on the surface of said substrate, and measures a quantity of an ion generated thereby.

4. The method according to claim 3, wherein energy provided to the hydrophobic process gas on the surface of said substrate is irradiation of a primary ion, and said analyzing section measures the quantity of the ion generated thereby using mass spectrometry.

5. The method according to claim 3, wherein the ion generated by irradiating the hydrophobic process gas on the surface of said substrate with the primary ion is either $C_3H_9Si^+$ or $C_3H_9OSi^-$.

6. The method according to claim 5, wherein energy provided to the hydrophobic process gas on the surface of said substrate is corona discharge, and said analyzing section measures the quantity of the ion-generated thereby using mass spectrometry.

7. The method according to claim 6, wherein the ion generated by performing corona discharge to the hydrophobic process gas on the surface of said substrate is any one of components having mass numbers of 73, 74, 75, 105 and 106.

8. The method according to claim 3, wherein said analyzing section irradiates an area out of a product region of the surface of said substrate with said ion.

9. The method according to claim 3, wherein said analyzing section irradiates a scribe line of the surface of said substrate with said ion.

10. The method according to claim 1, wherein said analyzing section is provided at an outer section of a resist pattern forming apparatus, and said transferring step transfers the substrate subjected to the hydrophobic process to said analyzing section from said resist pattern forming apparatus in a state that said substrate is contained in an airtight container.

11. The method according to claim 10, wherein an inactive gas is sealed in said airtight container.

12. A resist pattern forming method comprising the steps of:

analyzing a quantity of an ionic species in a sample hydrophobic gas of a known concentration previously;

supplying a hydrophobic process gas to a surface of a substrate to perform a hydrophobic process to the corresponding surface;

coating the surface of the substrate with a resist;

supplying a developing solution to the surface of the substrate subjected to exposure to light to perform developing;

detecting quantity of the ionic species of the hydrophobic process gas on the surface of the substrate subjected to the hydrophobic process;

evaluating the hydrophobic process state by comparing the analyzed result with the detected result; and adjusting a process condition of said hydrophobic process based on the evaluation.

13. The method according to claim 12, wherein the process condition of the hydrophobic process step to be adjusted is at least one of processing temperature at the time of the hydrophobic process, processing time at the time of the hydrophobic process, an amount of supply of a hydrophobic process gas at the time of the hydrophobic process, and degree of vacuum at the time of the hydrophobic process.

14. The method according to claim 12, further comprising the step of:

replacing the hydrophobic processing gas reserved in a reserving section that reserves the hydrophobic process gas to be supplied with a new gas thereof, based on the evaluation.

15. A method of processing a substrate, comprising the steps of:

obtaining a correlation of data between a quantity of a hydrophobic process gas on a surface of the substrate subjected to a hydrophobic processing and an adhesion of a resist pattern on the substrate previously;

supplying a hydrophobic process gas to a surface of a substrate to perform a hydrophobic process to the corresponding surface;

measuring the quantity of the hydrophobic process gas on the surface of the substrate subjected to the hydrophobic process;

evaluating the hydrophobic process state based on the correlation of data and the measured quantity of the hydrophobic process gas; and adjusting a process condition of said hydrophobic process based on the evaluation.

16. The method according to claim 15, wherein an item to be measured in the step of measuring the quantity of the hydrophobic process gas is at least one of Time of Flight Secondary Ion Mass Spectrometer (TOF-SIMS) and Atmospheric Pressure Ionization-Mass Spectrometer (API-MS).

17. The method according to claim 15, wherein the process condition of the hydrophobic process step to be adjusted is at least one of processing temperature at the time of the hydrophobic process, processing time at the time of the hydrophobic process, a quantity of supply of a hydrophobic process gas at the time of the hydrophobic process, and degree of vacuum at the time of the hydrophobic process.

18. The method according to claim 15, further comprising the step of:

replacing the hydrophobic processing gas reserved in a reserving section that reserves the hydrophobic process gas to be supplied, with a new gas thereof, based on the evaluation.

* * * * *